United States Patent
Camacho et al.

(10) Patent No.: US 7,855,444 B2
(45) Date of Patent: Dec. 21, 2010

(54) MOUNTABLE INTEGRATED CIRCUIT PACKAGE SYSTEM WITH SUBSTRATE

(75) Inventors: Zigmund Ramirez Camacho, Singapore (SG); Albelardo Jr. Hadap Advincula, Singapore (SG); Henry Descalzo Bathan, Singapore (SG); Lionel Chien Hui Tay, Singapore (SG)

(73) Assignee: Stats Chippac Ltd., Singapore (SG)

( * ) Notice: Subject to any disclaimer, the term of this patent is extended or adjusted under 35 U.S.C. 154(b) by 280 days.

(21) Appl. No.: 12/054,701

(22) Filed: Mar. 25, 2008

(65) Prior Publication Data

US 2009/0243067 A1 Oct. 1, 2009

(51) Int. Cl.
*H01L 23/02* (2006.01)

(52) U.S. Cl. .......... 257/686; 257/698; 257/E25.006; 257/E25.013; 257/E25.017; 257/E25.021; 257/E25.027; 257/E23.001; 257/E23.013; 257/E23.85

(58) Field of Classification Search ......... 257/666–676, 257/686, 698, 685, 723, 777, 25.005, E25.006, 257/E25.021, E25.027, E23.085; 438/109, 438/111, 112, 123, FOR. 366, FOR. 368, 438/FOR. 377, FOR. 380, FOR. 426
See application file for complete search history.

(56) References Cited

U.S. PATENT DOCUMENTS

| | | | |
|---|---|---|---|
| 5,386,343 A * | 1/1995 | Pao | 361/761 |
| 5,412,538 A * | 5/1995 | Kikinis et al. | 361/792 |
| 6,498,389 B1 | 12/2002 | Kim | |
| 6,515,356 B1 | 2/2003 | Shin et al. | |
| 6,541,856 B2 | 4/2003 | Corisis et al. | |
| 6,753,599 B2 * | 6/2004 | Kim | 257/686 |
| 6,777,798 B2 * | 8/2004 | Fukumoto et al. | 257/686 |
| 6,830,955 B2 | 12/2004 | Shin et al. | |
| 6,972,372 B1 | 12/2005 | Tsai et al. | |
| 6,982,488 B2 | 1/2006 | Shin et al. | |
| 7,151,013 B2 | 12/2006 | Corisis et al. | |
| 7,425,755 B2 | 9/2008 | Liu | |
| 2004/0108580 A1 | 6/2004 | Tan et al. | |
| 2009/0072412 A1 | 3/2009 | Camacho et al. | |
| 2009/0243066 A1 | 10/2009 | Camacho et al. | |

* cited by examiner

*Primary Examiner*—Jasmine J Clark
(74) *Attorney, Agent, or Firm*—Mikio Ishimaru

(57) ABSTRACT

A mountable integrated circuit package system includes: providing a substrate having an opening provided therein; providing an encapsulated integrated circuit package having an external leadfinger; mounting the encapsulated integrated circuit package by the external leadfinger proximate to the opening in the substrate; and connecting the external leadfinger and the substrate.

17 Claims, 6 Drawing Sheets

MOUNTABLE INTEGRATED CIRCUIT PACKAGE SYSTEM WITH SUBSTRATE

CROSS-REFERENCE TO RELATED APPLICATION(S)

This application relates to concurrently filed U.S. Non-Provisional patent application Ser. No. 12/054,682. The related application is assigned to STATS ChipPAC Ltd., and the subject matter thereof is incorporated herein by reference thereto.

TECHNICAL FIELD

The present invention relates generally to integrated circuit package system, and more particularly to integrated circuit package-in-package system.

BACKGROUND ART

Semiconductor package structures continue to advance toward miniaturization and thinning to increase the density of the components that are packaged and to decrease the sizes of the products made in implementation. This is in response to continually increasing demands on information and communication apparatus for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor die (or "chip") packages are of the type where a semiconductor die is molded into a package with a resin, such as an epoxy molding compound. The packages have a lead frame whose leads are projected from the package body, to provide a path for signal transfer between the die and external devices. Other conventional package configurations have contact terminals or pads formed directly on the surface of the package.

An exemplary semiconductor package, well known in the electronics industry, is the quad flat package ("QFP"). QFP packages typically comprise a lead frame, such as a conductive sheet stamped and etched, with a semiconductor die having a multitude of bond pads mounted to the top side of the lead frame. Wire bonds electrically connect the bond pads, of the semiconductor die, to a series of conductive leadfingers on the topside of the lead frame. Typically, the semiconductor die and the wire bonds are encapsulated within a molding compound.

This increased integrated circuit density has led to the development of multi-chip packages, a package in package (PIP), a package on package (POP), or a combination thereof in which more than one integrated circuit can be packaged. Each package provides mechanical support for the individual integrated circuits and one or more layers of interconnect lines that enable the integrated circuits to be connected electrically to surrounding circuitry. Current multi-chip packages, also commonly referred to as multi-chip modules, typically consist of a substrate onto which a set of separate integrated circuit components are attached. Such multi-chip packages have been found to increase integrated circuit density and miniaturization, improve signal propagation speed, reduce overall integrated circuit size and weight, improve performance, and lower costs all of which are primary goals of the computer industry.

Thus, a need still remains for an integrated circuit package system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a mountable integrated circuit package system that includes: providing a substrate having an opening provided therein; providing an encapsulated integrated circuit package having an external leadfinger; mounting the encapsulated integrated circuit package by the external leadfinger proximate to the opening in the substrate; and connecting the external leadfinger and the substrate.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
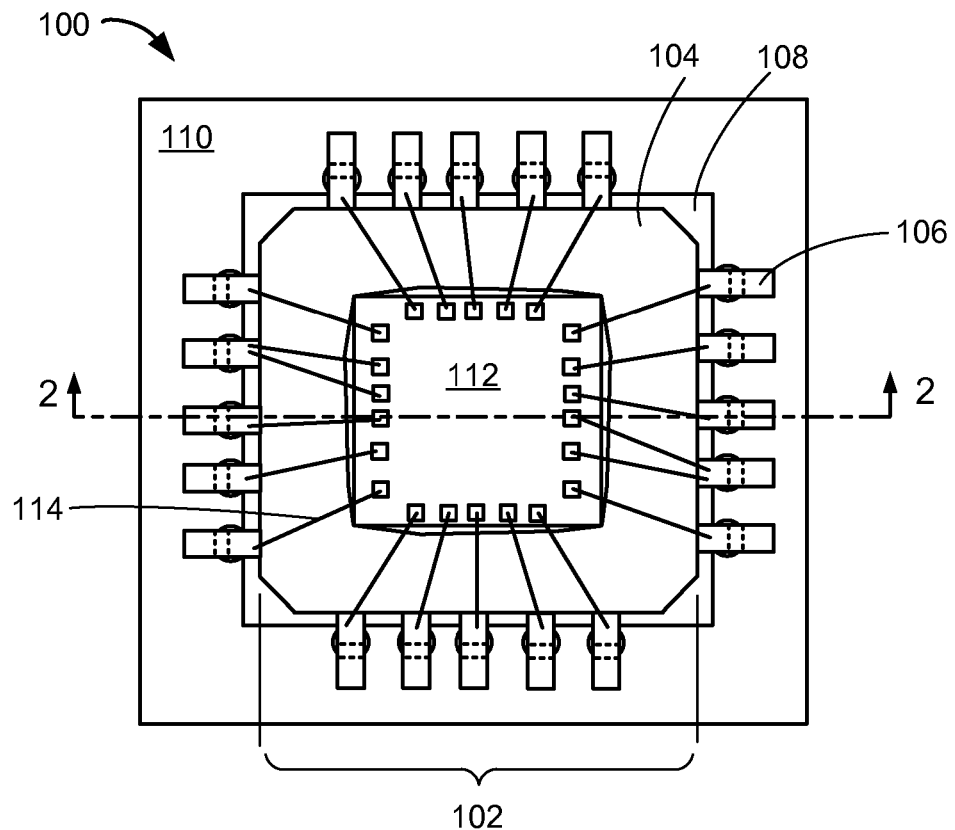
FIG. 1 is a top plan view of a mountable integrated circuit package system without a cover in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing figures. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, or removal of the material or as required in forming a described structure. The term "system" as used herein means and refers to the method and to the apparatus of the present invention in accordance with the context in which the term is used.

Referring now to FIG. 1, therein is shown a top plan view of a mountable integrated circuit package system 100 without a cover in a first embodiment of the present invention. The top view depicts an encapsulated integrated circuit package 102 having an inner encapsulation 104, such as of an epoxy molding compound, that partially exposes an external leadfinger 106, such as from a singulated lead frame. The encapsulated integrated circuit package 102 is mounted in an opening 108 of a substrate 110. The external leadfinger 106 is over and connected to the substrate 110 to provide electrical connection between the encapsulated integrated circuit package 102 and the substrate 110.

A first stacking integrated circuit device 112, such as an integrated circuit die, is mounted over the encapsulated integrated circuit package 102, such as with a die-attach adhesive. The first stacking integrated circuit device 112 is optional. A first inner interconnect 114, such as a bond wire or a ribbon bond, connects between the first stacking integrated circuit device 112 and the external leadfinger 106.

Figure 2:
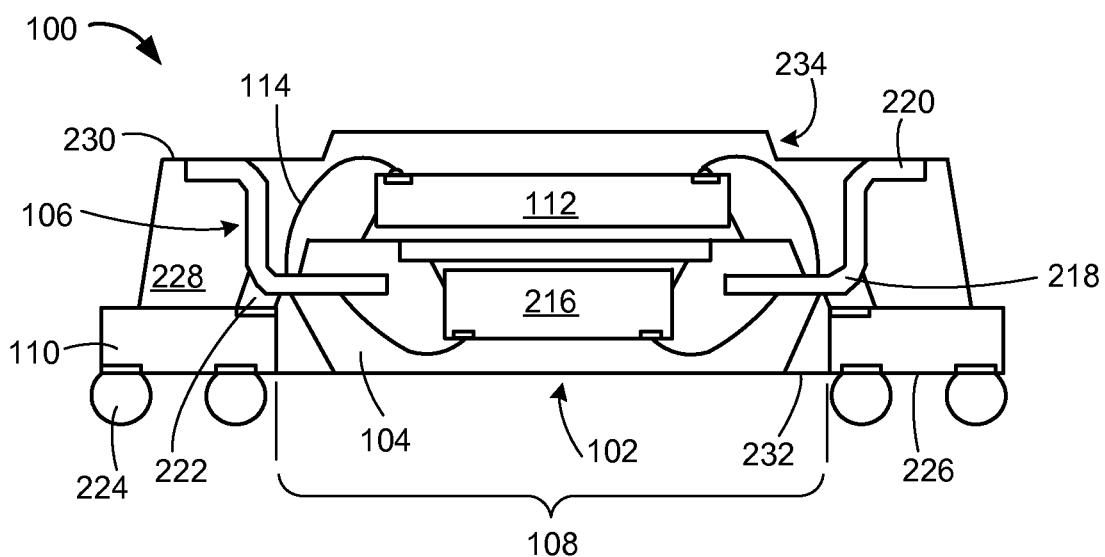
FIG. 2 is a cross-sectional view of the mountable integrated circuit package system along line 2-2 of FIG. 1.

Referring now to FIG. 2, therein is shown a cross-sectional view of the mountable integrated circuit package system 100 along line 2-2 of FIG. 1. The cross-sectional view depicts the encapsulated integrated circuit package 102 in the opening 108, with the external leadfinger 106 preferably connected over the substrate 110. The encapsulated integrated circuit package 102 includes an inner integrated circuit device 216, such as one or more wire bonded dice or flip chips, connected to the external leadfinger 106. The substrate 110 may include structures (not shown), such as metal traces, metal layers, insulating layers, electrical vias, landing pads, or a combination thereof. The inner encapsulation 104 covers the inner integrated circuit device 216 and partially exposes the external leadfinger 106 for further electrical connection.

The external leadfinger 106 may be planar or non-planar in configuration. In this example, the external leadfinger 106 depicts a non-planar configuration having a shoulder 218 and an outer tip 220, with the shoulder 218 preferably connected to the substrate 110. An intraconnect 222, such as a solder ball or solder paste, between the shoulder 218 and the substrate 110 provides electrical connection between the inner integrated circuit device 216, the external leadfinger 106, and the substrate 110. Optionally, a first external interconnect 224, such as a solder ball, is formed on a bottom substrate side 226 of the substrate 110 for electrical connection to the next level system.

The first stacking integrated circuit device 112, which is optional, is mounted over the encapsulated integrated circuit package 102 such as with a die-attach adhesive. The first inner interconnect 114 connects between the first stacking integrated circuit device 112 and the external leadfinger 106. The external leadfinger 106 provides electrical connection between the inner integrated circuit device 216, the substrate 110, the first stacking integrated circuit device 112, or a combination thereof.

An outer encapsulation 228, such as of an epoxy molded compound, is formed over the first stacking integrated circuit device 112, the first inner interconnect 114, the encapsulated integrated circuit package 102, the opening 108, partially exposing the external leadfinger 106 and the substrate 110. The outer encapsulation 228 includes a top encapsulation side 230 and a bottom encapsulation side 232. In this example, the top encapsulation side 230 optionally incorporates a protrusion 234 to provide additional clearance for the first stacking integrated circuit device 112. In this example, the top encapsulation side 230 also partially exposes the outer tip 220, with the outer tip 220 preferably distributed on the top encapsulation side 230 for further electrical connection to the next level system.

It has been discovered that the present invention provides a mountable integrated circuit package system that reduces package height by mounting an encapsulated integrated circuit package in an opening of a substrate. The encapsulated integrated circuit package further serves as a platform to mount additional stacking integrated circuit packages over the encapsulated integrated circuit package.

It has been discovered that the mountable integrated circuit package system of this invention further reduces the package construction complexity by partially exposing a leadfinger at a top encapsulation side, while reducing costly wire bonding or signal-loss in printed circuit board (PCB) for re-routing electrical connections between the inner integrated circuit device and additional stacking integrated circuit devices. Moreover, the mountable integrated circuit package system also provides a structure for stacking additional integrated circuit devices over an inner integrated circuit device.

Figure 3:
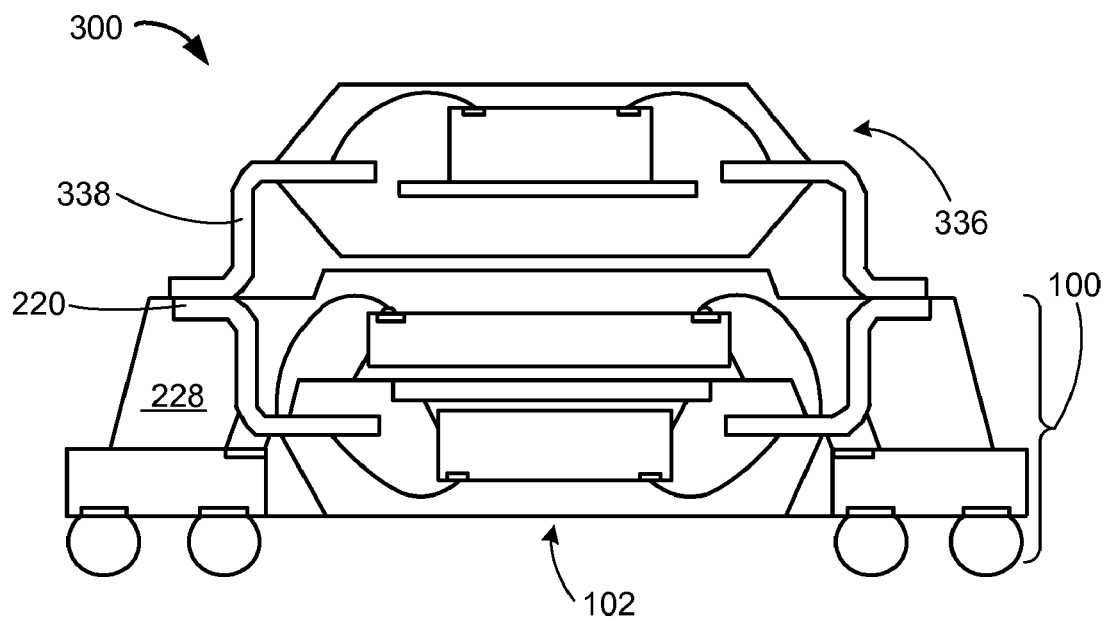
FIG. 3 is a cross-sectional view of an integrated circuit package-on-package system including the mountable integrated circuit package system of FIG. 2 in a second embodiment and an application of the present invention.

Referring now to FIG. 3, therein is shown a cross-sectional view of an integrated circuit package-on-package system 300 including the mountable integrated circuit package system 100 of FIG. 2 in a second embodiment of the present invention. A second stacking integrated circuit device 336, such as a packaged single or multi-stacked integrated circuit dice, is mounted over the outer encapsulation 228 over the encapsulated integrated circuit package 102. A second external interconnect 338 of the second stacking integrated circuit device 336, such as a leadfinger from a singulated lead frame, is connected to the outer tip 220 for electrical connection between the second stacking integrated circuit device 336 and the mountable integrated circuit package system 100.

It has been discovered that the present invention provides a mountable integrated circuit package system that facilitates electrical connection to an additional stacking integrated circuit device above the system with partially exposed leadfinger at the top encapsulation side and solder ball formed under the bottom encapsulation side.

It has further been discovered that the present invention provides a mountable integrated circuit package system that increases the integrated circuit density both in a package-in-package (PIP) and a package-on-package (POP) application. The encapsulated integrated circuit package further serves as a platform for a modular, multiple device structure, such as a package-in-package or a package-on-package structure.

It has been discovered that the present invention provides a mountable integrated circuit package system partially exposing a leadfinger at a top encapsulation side that facilitates mounting and connecting a stacking integrated circuit package over the top encapsulation side.

Figure 4:
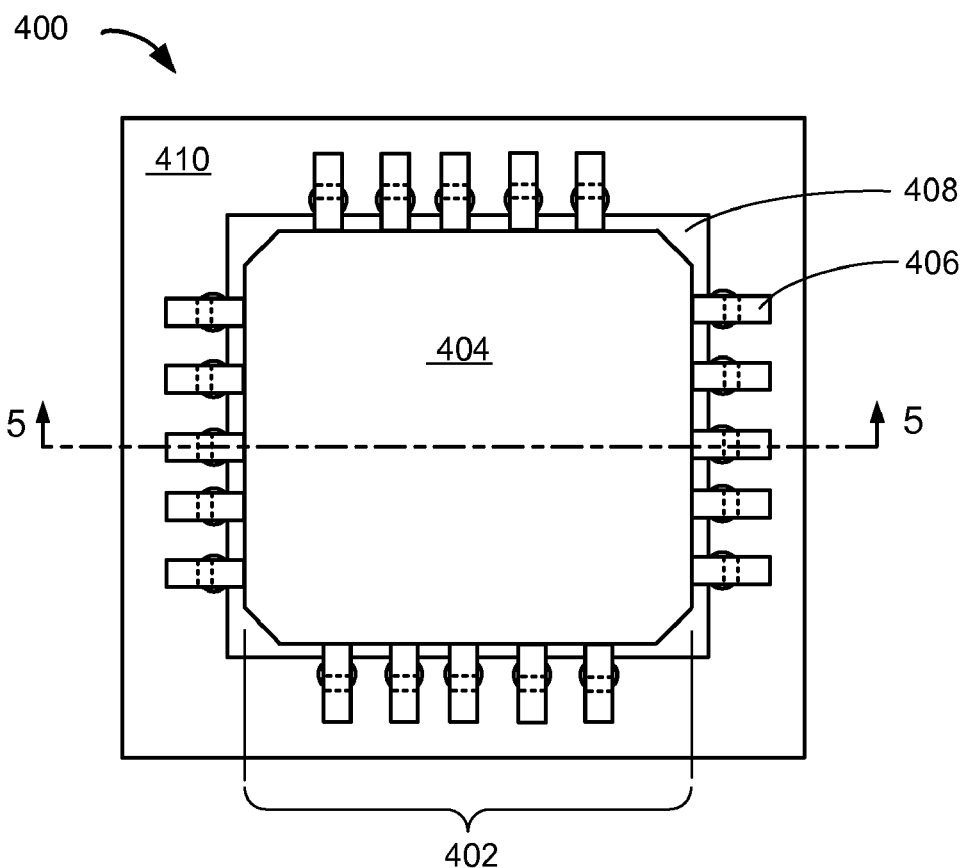
FIG. 4 is a top plan view of a mountable integrated circuit package system in a third embodiment of the present invention.

Referring now to FIG. 4, therein is shown a top plan view of a mountable integrated circuit package system 400 in a third embodiment of the present invention. The top view depicts an encapsulated integrated circuit package 402 having an inner encapsulation 404, such as of an epoxy molding compound, that partially exposes an external leadfinger 406, such as from a singulated lead frame. The encapsulated integrated circuit package 402 is mounted in an opening 408 of a substrate 410. The external leadfinger 406, which may be planar or non-planar in configuration, is over and connected to the substrate 410 to provide electrical connection between the encapsulated integrated circuit package 402 and the substrate 410.

Figure 5:
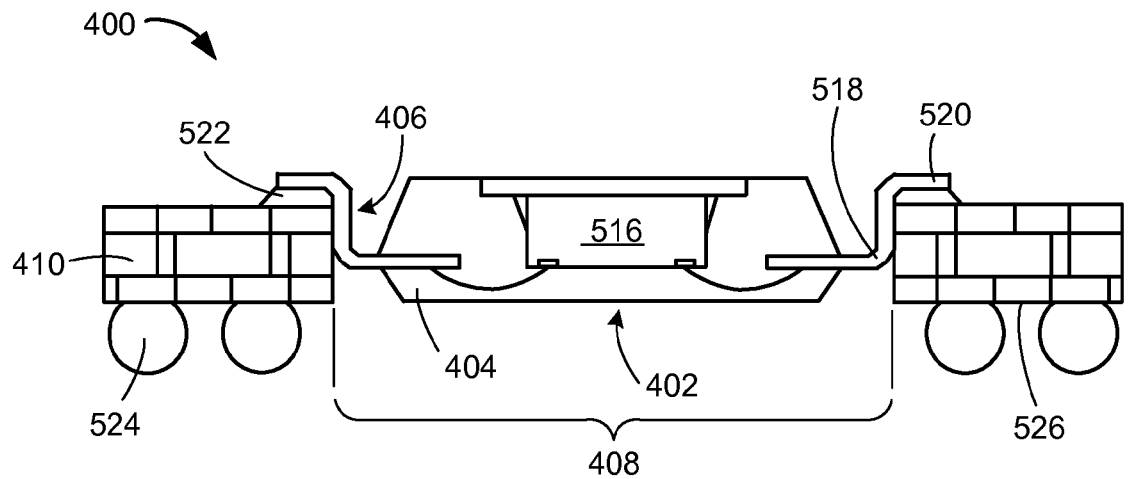
FIG. 5 is a cross-sectional view of the mountable integrated circuit package system along line 5-5 of FIG. 4.

Referring now to FIG. 5, therein is shown a cross-sectional view of the mountable integrated circuit package system 400 along line 5-5 of FIG. 4. The cross-sectional view depicts the encapsulated integrated circuit package 402 in the opening 408, with the external leadfinger 406 preferably connected over the substrate 410. The encapsulated integrated circuit package 402 includes an inner integrated circuit device 516, such as an integrated circuit die, connected to the external leadfinger 406. The substrate 410 may include structures (not shown), such as metal traces, metal layers, insulating layers, electrical vias, landing pads, or a combination thereof. The inner encapsulation 404 covers the inner integrated circuit device 516 and partially exposes the external leadfinger 406 for further electrical connection.

In this example, the external leadfinger 406 is depicted in a non-planar configuration including a shoulder 518 and an outer tip 520, with the outer tip 520 preferably connected to the substrate 410. An intraconnect 522, such as a solder ball or solder paste, between the shoulder 518 and the substrate 410 provides of electrical connection between the inner integrated circuit device 516, the external leadfinger 406, and the substrate 410. Optionally, a first external interconnect 524, such as a solder ball, is formed on a bottom substrate side 526 of the substrate 410 for electrical connection to the next level system.

Figure 6:
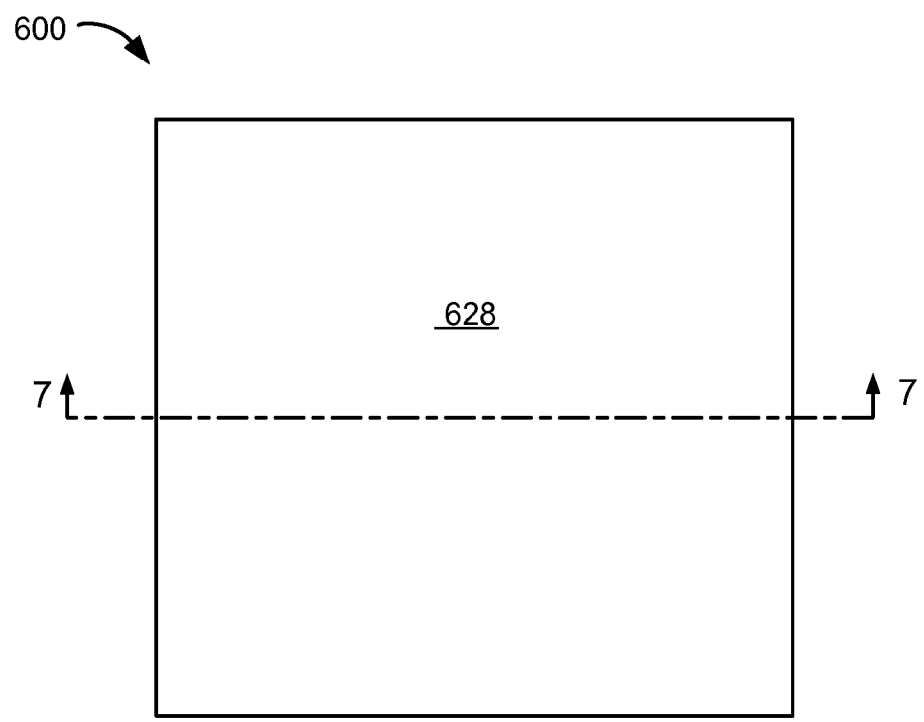
FIG. 6 is a top view of a mountable integrated circuit package system in a fourth embodiment of the present invention.

Referring now to FIG. 6, therein is shown a top view of a mountable integrated circuit package system 600 in a fourth embodiment of the present invention. The top plan view depicts an outer encapsulation 628, such as of epoxy molding compound. Further detail of the mountable integrated circuit package system 600 is described relative to FIG. 7.

Figure 7:
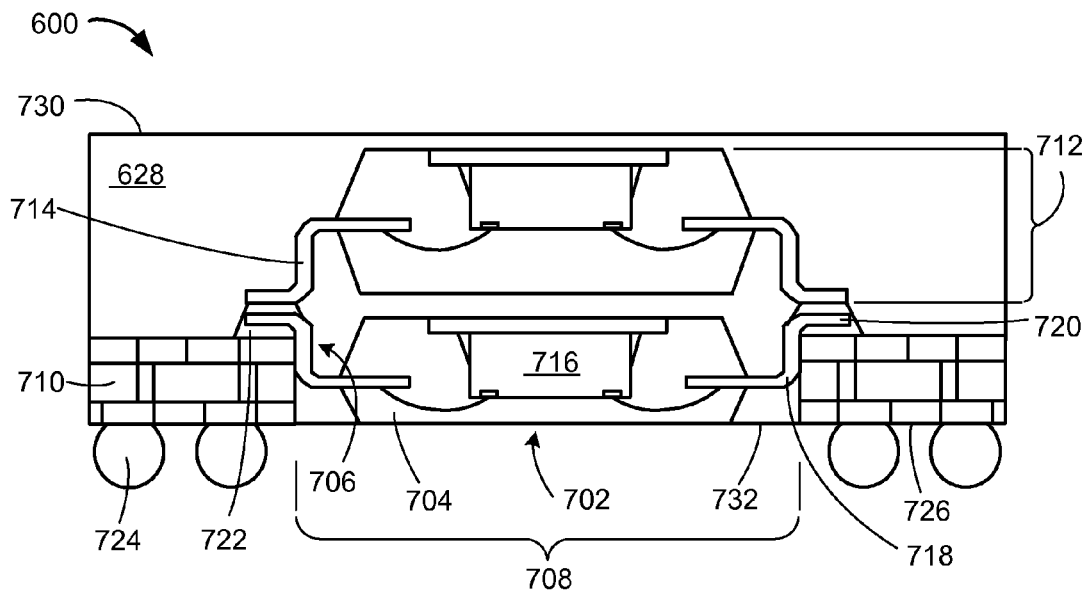
FIG. 7 is a cross-sectional view a the mountable integrated circuit package system along line 7-7 of FIG. 6.

Referring now to FIG. 7, therein is shown a cross-sectional view of the mountable integrated circuit package system 600 along line 7-7 of FIG. 6. The cross-sectional view depicts an encapsulated integrated circuit package 702 in an opening 708, with an external leadfinger 706 of the encapsulated integrated circuit package 702 mounted over a substrate 710. The encapsulated integrated circuit package 702 includes an inner integrated circuit device 716 connected to the external leadfinger 706. The substrate 710 may include structures (not shown), such as metal traces, metal layers, insulating layers, electrical vias, landing pads, or a combination thereof. An inner encapsulation 704 covers the inner integrated circuit device 716, and partially exposes the external leadfinger 706 for further electrical connection.

In this example, the external leadfinger 706 includes a shoulder 718 and an outer tip 720, with the outer tip 720 preferably connected to the substrate 710. An intraconnect 722, such as a solder ball or solder paste, between the outer tip 720 and the substrate 710 provides routing of electrical connection between the inner integrated circuit device 716, the external leadfinger 706, the substrate 710, or a combination thereof. Optionally, a first external interconnect 724, such as a solder ball, is formed on a bottom substrate side 726 of the substrate 710 for electrical connection to the next level system.

A first stacking integrated circuit device 712, such as a packaged integrated circuits, is mounted over the encapsulated integrated circuit package 702. A first inner interconnect 714 of the first stacking integrated circuit device 712, such as a leadfinger from a singulated lead frame, connects between the first stacking integrated circuit device 712 and the external leadfinger 706 for electrical connection. In this example, the first stacking integrated circuit device 712 is mounted over the encapsulated integrated circuit package 702, over the inner encapsulation 704 and connected to the outer tip 720.

The outer encapsulation 628, such as of an epoxy molded compound, is formed over the first stacking integrated circuit device 712, the first inner interconnect 714, the encapsulated integrated circuit package 702, the opening 708, partially exposing the substrate 710. The outer encapsulation 628 includes a top encapsulation side 730 and a bottom encapsulation side 732, with the first external interconnect 724 on the bottom substrate side 726 exposed from the bottom encapsulation side 732.

Figure 8:
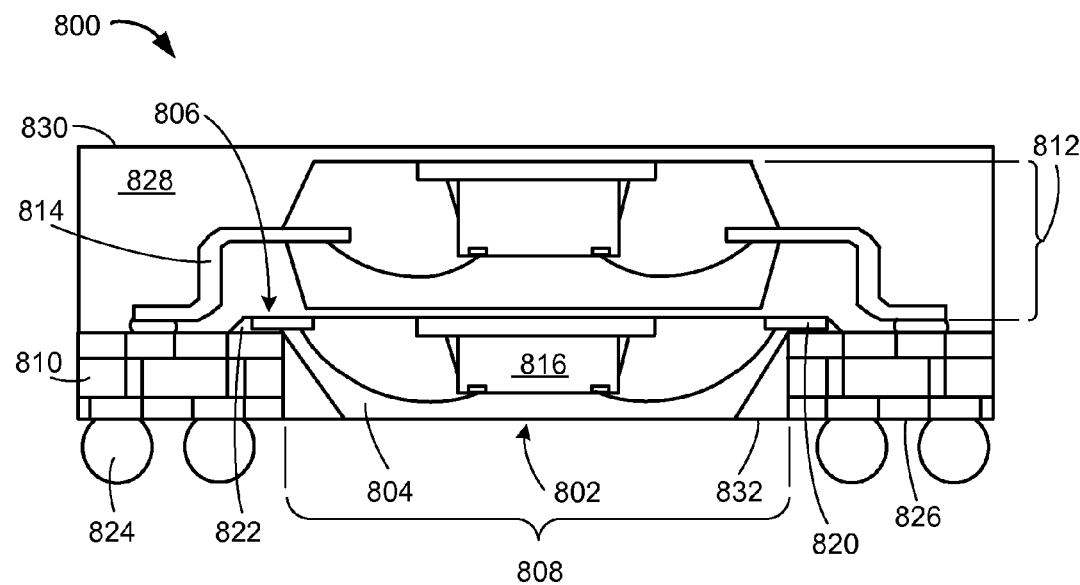
FIG. 8 is a cross-sectional view of a mountable integrated circuit package system having a top view exemplified by FIG. 6 in a fifth embodiment of the present invention.

Referring now to FIG. 8, therein is shown a cross-sectional view of a mountable integrated circuit package system 800 having a top view exemplified by FIG. 6 in a fifth embodiment of the present invention. The cross-sectional view depicts an encapsulated integrated circuit package 802 in an opening 808, with an external leadfinger 806 of the encapsulated integrated circuit package 802 mounted over a substrate 810. The encapsulated integrated circuit package 802 includes an inner integrated circuit device 816 connected to the external leadfinger 806. The substrate 810 may include structures (not shown), such as metal traces, metal layers, insulating layers, electrical vias, landing pads, or a combination thereof. An inner encapsulation 804 covers the inner integrated circuit device 816, and partially exposes the external leadfinger 806 for further electrical connection.

In this example, the external leadfinger 806 is depicted in a planar configuration with an outer tip 820 of the external leadfinger 806 exposed from the inner encapsulation 804 and connected to the substrate 810. An intraconnect 822, such as a solder ball or solder paste, between the outer tip 820 and the substrate 810 provides routing of electrical connection between the inner integrated circuit device 816, the external leadfinger 806, the substrate 810, or a combination thereof. Optionally, a first external interconnect 824, such as a solder ball, is formed on a bottom substrate side 826 of the substrate 810 for electrical connection to the next level system.

A first stacking integrated circuit device 812, such as a packaged integrated circuits, is mounted over the encapsulated integrated circuit package 802. A first inner interconnect 814 of the first stacking integrated circuit device 812, such as a leadfinger from a singulated lead frame, connects between the first stacking integrated circuit device 812 and the substrate 810 for electrical connection. In this example, the first stacking integrated circuit device 812 is mounted over the encapsulated integrated circuit package 802, with the first inner interconnect 814 connected over the substrate 810 adjacent to the external leadfinger 806.

An outer encapsulation 828, such as of an epoxy molded compound, is formed over the first stacking integrated circuit device 812, the first inner interconnect 814, the encapsulated integrated circuit package 802, the opening 808, partially exposing the substrate 810. The outer encapsulation 828 includes a top encapsulation side 830 and a bottom encapsulation side 832, with the first external interconnect 824 exposed from the bottom encapsulation side 832.

Figure 9:
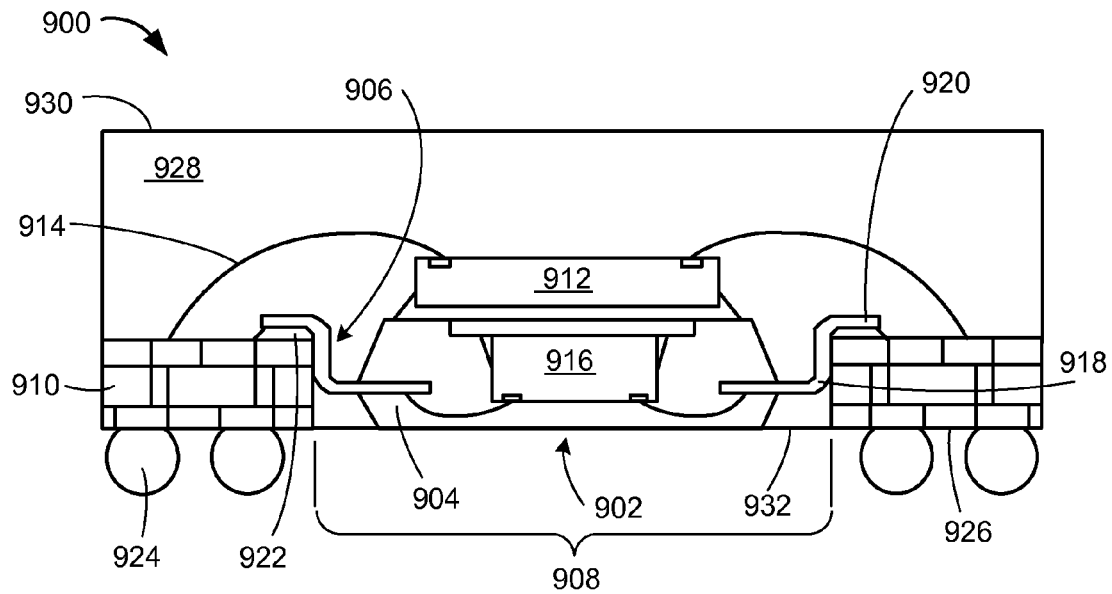
FIG. 9 is a cross-sectional view of a mountable integrated circuit package system having a top view exemplified by FIG. 6 in a sixth embodiment of the present invention.

Referring now to FIG. 9, therein is shown a cross-sectional view of a mountable integrated circuit package system 900 having a top view exemplified by FIG. 6 in a sixth embodiment of the present invention. The cross-sectional view depicts an encapsulated integrated circuit package 902 in an opening 908, with an external leadfinger 906 of the encapsulated integrated circuit package 902 mounted over a substrate 910. The encapsulated integrated circuit package 902 includes an inner integrated circuit device 916 connected to the external leadfinger 906. The substrate 910 may include structures (not shown), such as metal traces, metal layers, insulating layers, electrical vias, landing pads, or a combination thereof. An inner encapsulation 904 covers the inner integrated circuit device 916, and partially exposes the external leadfinger 906 for further electrical connection.

In this example, the external leadfinger is non-planar in configuration including a shoulder 918 and an outer tip 920, with the outer tip 920 preferably connected to the substrate 910. An intraconnect 922, such as a solder ball or solder paste, between the outer tip 920 and the substrate 910 provides routing of electrical connection between the inner integrated circuit device 916, the external leadfinger 906, the substrate 910, or a combination thereof. Optionally, a first external interconnect 924, such as a solder ball, is formed on a bottom substrate side 926 of the substrate 910 for electrical connection to the next level system.

A first stacking integrated circuit device 912, such as a wire bonded die, a ball grid array device (BGA), or a land grid array (LGA), is mounted over the encapsulated integrated circuit package 902. A first inner interconnect 914, such as a bond wire or a ribbon bond, connects between the first stacking integrated circuit device 912 and the substrate 910 for electrical connection. In this example, the first stacking integrated circuit device 912 is mounted over the encapsulated integrated circuit package 902, over the inner encapsulation 904, such as with a die-attach adhesive. The first inner interconnect 914 preferably connects to the substrate 910 adjacent to the external leadfinger 906.

An outer encapsulation 928, such as of an epoxy molded compound, is formed over the first stacking integrated circuit device 912, the first inner interconnect 914, the encapsulated integrated circuit package 902, the opening 908, and partially exposing the substrate 910. The outer encapsulation 928 includes a top encapsulation side 930 and a bottom encapsulation side 932 with the first external interconnect 924 exposed from the bottom encapsulation side.

Figure 10:
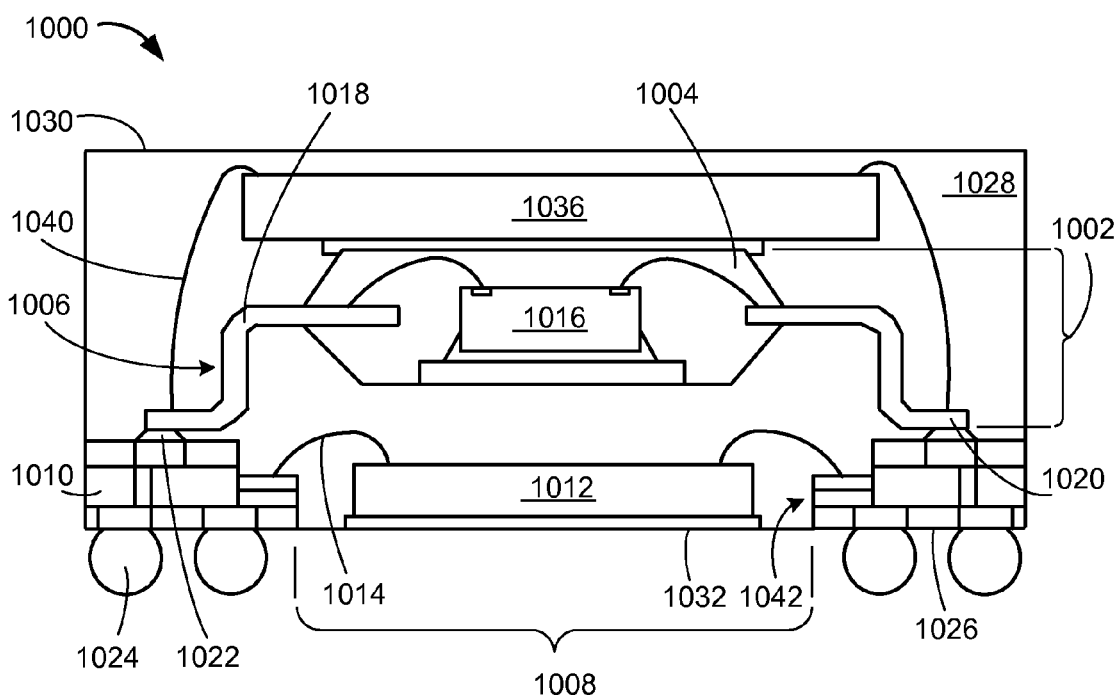
FIG. 10 is a cross-sectional view of a mountable integrated circuit package system having a top view as exemplified by FIG. 6 in a seventh embodiment of the present invention.

Referring now to FIG. 10, therein is shown a cross-sectional view of a mountable integrated circuit package system 1000 having a top view exemplified by FIG. 6 in a seventh embodiment of the present invention. The cross-sectional view depicts an encapsulated integrated circuit package 1002 over an opening 1008, with an external leadfinger 1006 of the encapsulated integrated circuit package 1002 mounted over a substrate 1010. The encapsulated integrated circuit package 1002 includes an inner integrated circuit device 1016 connected to the external leadfinger 1006. The substrate 1010 may include structures (not shown), such as metal traces, metal layers, insulating layers, electrical vias, landing pads, or a combination thereof. An inner encapsulation 1004 covers the inner integrated circuit device 1016, and partially exposes the external leadfinger 1006 for further electrical connection.

In this example, the external leadfinger 1006 is non-planar in configuration including a shoulder 1018 and an outer tip 1020, preferably with the outer tip 1020 connected to the substrate 1010. An intraconnect 1022, such as a solder ball or solder paste, between the outer tip 1020 and the substrate 1010 provides routing of electrical connection between the inner integrated circuit device 1016, the external leadfinger 1006, the substrate 1010, or a combination thereof. Optionally, a first external interconnect 1024, such as a solder ball, is formed on a bottom substrate side 1026 of the substrate 1010 for electrical connection to the next level system.

A first stacking integrated circuit device 1012, such as a wire bonded die, a ball grid array device (BGA), or a land grid array (LGA), may be optionally mounted under the encapsulated integrated circuit package 1002. A first inner interconnect 1014, such as a bond wire or a ribbon bond, connects between the first stacking integrated circuit device 1012 and the substrate 1010 for electrical connection. In this example, the first stacking integrated circuit device 1012 is mounted under the encapsulated integrated circuit package 1002. The first inner interconnect 1014 preferably connects the first stacking integrated circuit device 1012 and a substrate step 1042 of the substrate 1010, adjacent to the external leadfinger 1006, to provide additional clearance for the first inner interconnect 1014.

Optionally, a second stacking integrated circuit device 1036, such as a wire bonded die, a ball grid array device (BGA), or a land grid array (LGA), may be additionally mounted over the encapsulated integrated circuit package 1002. A second inner interconnect 1040, such as a bond wire or a ribbon bond, connects between the second stacking integrated circuit device 1036 and the substrate 1010 for electrical connection. In this example, the second stacking integrated circuit device 1036 is mounted over the encapsulated integrated circuit package 1002. The second inner interconnect 1040 preferably connects the second stacking integrated circuit device 1036 and the external leadfinger 1006.

An outer encapsulation 1028, such as of an epoxy molded compound, is formed over the first stacking integrated circuit device 1012, the second stacking integrated circuit device 1036, the encapsulated integrated circuit package 1002, the opening 1008, and partially exposing the substrate 1010. The outer encapsulation 1028 includes a top encapsulation side 1030 and a bottom encapsulation side 1032, with the first external interconnect 1024 exposed from the bottom encapsulation side 1032.

Figure 11:
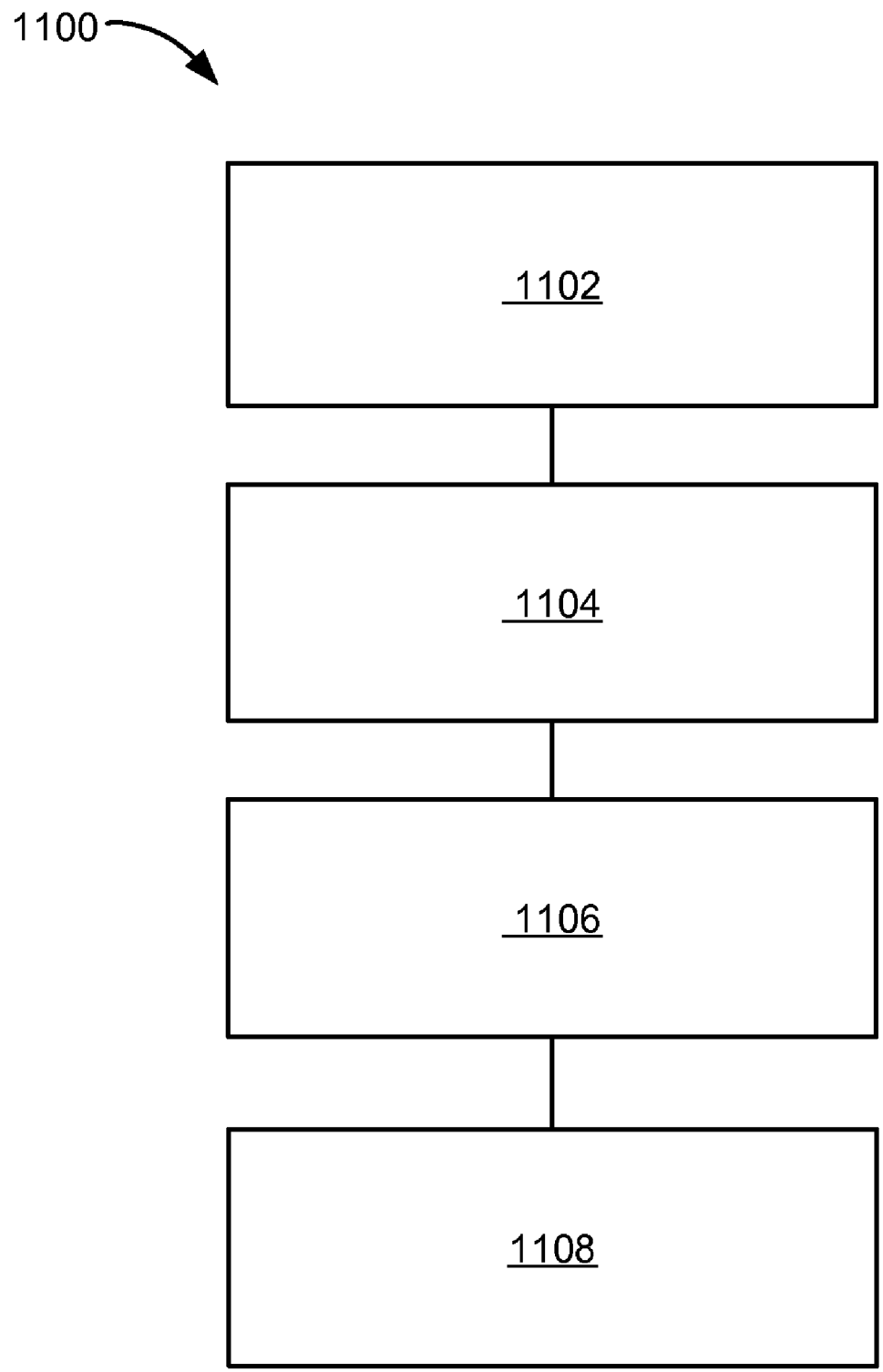
FIG. 11 is a flow chart of an integrated circuit package system for manufacturing of the mountable integrated circuit package system in an embodiment of the present invention.

Referring now to FIG. 11, therein is shown a flow chart of an integrated circuit package system 1100 for manufacturing of the mountable integrated circuit package system of FIG. 1 in an embodiment of the present invention. The system 1100 comprises: a mountable integrated circuit package system comprising: providing a substrate having an opening provided in a block 1102; providing an encapsulated integrated circuit package having an external leadfinger in a block 1104; mounting the encapsulated integrated circuit package by the external leadfinger proximate to the opening in the substrate in a block 1106; and connecting the external leadfinger and the substrate in a block 1108.

It has been discovered that the present invention provides a mountable integrated circuit package system that reduces package height by mounting an encapsulated integrated circuit package in an opening of a substrate. The encapsulated integrated circuit package further serves as a platform to mount additional stacking integrated circuit packages over the encapsulated integrated circuit package.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the mountable integrated circuit package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A mountable integrated circuit package system comprising:
   providing a substrate having a through opening provided therein;
   providing an encapsulated integrated circuit package having an external leadfinger;
   mounting the encapsulated integrated circuit package by the external leadfinger proximate to the opening in the substrate; and
   connecting a shoulder of the external leadfinger and the substrate.

2. The system as claimed in claim 1 wherein mounting the encapsulated integrated circuit package includes connecting an outer tip of the external leadfinger and the substrate.

3. The system as claimed in claim 1 further comprising forming an outer encapsulation over the encapsulated integrated circuit package.

4. The system as claimed in claim 1 further comprising forming an outer encapsulation over the encapsulated integrated circuit package, partially exposing the external leadfinger from the outer encapsulation.

5. A mountable integrated circuit package system comprising:
   providing a substrate having a through opening provided therein;
   providing an encapsulated integrated circuit package having an external leadfinger;
   mounting the encapsulated integrated circuit package by the external leadfinger proximate to the opening in the substrate;
   connecting the external leadfinger and the substrate;
   forming an external interconnect under the substrate; and
   connecting a first stacking integrated circuit device mounted over the encapsulated integrated circuit package, and the external leadfinger.

6. The system as claimed in claim 5 further comprising connecting a first stacking integrated circuit device, mounted over the encapsulated integrated circuit package, and the substrate.

7. The system as claimed in claim 5 further comprising connecting a first stacking integrated circuit device, mounted under the encapsulated integrated circuit package, and the substrate.

8. The system as claimed in claim 5 further comprising:
   forming an outer encapsulation over the encapsulated integrated circuit package, partially exposing the outer tip from the outer encapsulation; and
   connecting a second stacking integrated circuit device to the outer tip over the outer encapsulation.

9. A mountable integrated circuit package system comprising:
   a substrate having a through opening provided therein;
   an encapsulated integrated circuit package having an external leadfinger, mounted by the external leadfinger proximate to the opening; and
   an intraconnect connected between a shoulder of the external leadfinger, that is over the substrate, and the substrate.

10. The system as claimed in claim 9 wherein an outer tip of the external leadfinger is connected over the substrate.

11. The system as claimed in claim 9 further comprising an outer encapsulation over the encapsulated integrated circuit package.

12. The system as claimed in claim 9 further comprising an outer encapsulation formed over the encapsulated integrated circuit package, partially exposing the external leadfinger from the outer encapsulation.

13. The system as claimed in claim 9 further comprising a first external interconnect formed under the substrate.

14. The system as claimed in claim 13 further comprising a first stacking integrated circuit device mounted over the encapsulated integrated circuit package and connected to the external leadfinger.

15. The system as claimed in claim 13 further comprising a first stacking integrated circuit device mounted over the encapsulated integrated circuit package and connected to the substrate.

16. The system as claimed in claim 13 further comprising a first stacking integrated circuit device, mounted under the encapsulated integrated circuit package, and connected to the substrate.

17. The system as claimed in claim 13 further comprising:
an outer encapsulation formed over the encapsulated integrated circuit package with the outer tip leadfinger partially exposed from the outer encapsulation; and a second stacking integrated circuit device connected to the leadfinger over the outer encapsulation.

\* \* \* \* \*

UNITED STATES PATENT AND TRADEMARK OFFICE
CERTIFICATE OF CORRECTION

| | | |
|---|---|---|
| PATENT NO. | : 7,855,444 B2 | Page 1 of 1 |
| APPLICATION NO. | : 12/054701 | |
| DATED | : December 21, 2010 | |
| INVENTOR(S) | : Camacho et al. | |

It is certified that error appears in the above-identified patent and that said Letters Patent is hereby corrected as shown below:

Title page, INID (75) Inventors:

Delete "Albelardo Jr. Hadap Advincula , Singapore (SG);" and insert therefor
-- Abelardo Jr. Hadap Advincula, Singapore (SG); --

Column 10, Claim 5, line 12, delete "circuit device" and insert therefor -- circuit device, --

Signed and Sealed this
First Day of March, 2011

David J. Kappos
*Director of the United States Patent and Trademark Office*